US008627920B2

(12) United States Patent
Moore

(10) Patent No.: US 8,627,920 B2
(45) Date of Patent: Jan. 14, 2014

(54) FOLDED HORN ENCLOSURE WITH INTER-CHANNEL REFLEX-PORTING

(76) Inventor: Dana A. Moore, Bothell, WA (US)

( * ) Notice: Subject to any disclaimer, the term of this patent is extended or adjusted under 35 U.S.C. 154(b) by 45 days.

(21) Appl. No.: 13/403,585

(22) Filed: Feb. 23, 2012

(65) Prior Publication Data

US 2013/0220730 A1 Aug. 29, 2013

(51) Int. Cl.

| | |
|---|---|
| ***H05K 5/02*** | (2006.01) |
| ***G10K 11/02*** | (2006.01) |
| ***H04R 1/30*** | (2006.01) |
| *H05K 5/00* | (2006.01) |
| *G10K 11/00* | (2006.01) |
| *H04R 1/02* | (2006.01) |

(52) U.S. Cl.
USPC ........... 181/156; 181/155; 181/152; 181/192; 381/341; 381/352

(58) Field of Classification Search
USPC ......... 181/156, 155, 152, 192, 199, 177, 148, 181/194, 187, 188; 381/341, 352, 160, 349, 381/338, 340, 345, 337, 339, 342
See application file for complete search history.

(56) References Cited

U.S. PATENT DOCUMENTS

| | | | | |
|---|---|---|---|---|
| 3,108,653 | A * | 10/1963 | Valldeperas | 181/150 |
| 3,912,866 | A * | 10/1975 | Fox | 381/352 |
| 4,014,597 | A * | 3/1977 | Griffin, Jr. | 312/7.1 |
| 4,173,266 | A * | 11/1979 | Pizer et al. | 181/156 |
| 4,210,223 | A * | 7/1980 | Gillum et al. | 181/152 |
| 4,215,761 | A * | 8/1980 | Andrews | 181/152 |
| 4,286,688 | A * | 9/1981 | O'Malley | 181/156 |
| 4,313,032 | A * | 1/1982 | Thomas et al. | 381/341 |
| 4,509,192 | A * | 4/1985 | Straughn | 381/348 |
| 4,524,846 | A * | 6/1985 | Whitby | 181/152 |
| 4,860,367 | A * | 8/1989 | Hook | 381/341 |
| 5,099,948 | A * | 3/1992 | Melhart | 181/152 |
| 5,266,752 | A * | 11/1993 | Cussans | 181/155 |
| 5,321,388 | A * | 6/1994 | Biersach | 340/404.1 |
| 5,359,158 | A * | 10/1994 | Queen | 181/150 |
| 5,637,840 | A * | 6/1997 | Kim | 181/152 |
| 5,804,774 | A * | 9/1998 | Ford et al. | 181/152 |
| 5,825,900 | A * | 10/1998 | Jeon | 381/339 |
| 6,144,751 | A * | 11/2000 | Velandia | 381/345 |
| 7,233,677 | B2 * | 6/2007 | Moore | 381/341 |
| 7,252,176 | B2 * | 8/2007 | Moore | 181/199 |
| 7,506,721 | B2 * | 3/2009 | Moore | 181/156 |
| 7,513,332 | B2 * | 4/2009 | Moore | 181/155 |
| 7,520,368 | B2 * | 4/2009 | Moore | 181/155 |
| 7,556,122 | B2 * | 7/2009 | Moore | 181/156 |
| 7,743,878 | B1 * | 6/2010 | Moore | 181/152 |
| 8,406,444 | B2 * | 3/2013 | Wang | 381/335 |
| 2003/0228027 | A1 * | 12/2003 | Czerwinski | 381/342 |
| 2004/0238268 | A1 * | 12/2004 | Danley et al. | 181/199 |
| 2005/0047622 | A1 * | 3/2005 | Graber | 381/342 |

* cited by examiner

*Primary Examiner* — Edgardo San Martin

(57) ABSTRACT

A low frequency exponential folded horn enclosure employing a bifurcated horn terminal pathway and a single driver with a bifurcated throat channel, with driver access from the top or bottom of the enclosure. The horizontal "butterfly" throat is located at the rear of the enclosure and expands vertically, and the vertically arranged bifurcated horn terminus exhausts in a mostly forward direction on opposite sides of the back chamber which is reflex-ported; said ports arranged to each exhaust into the channel folds at each respective corner of the terminal horn channel.

15 Claims, 2 Drawing Sheets

FOLDED HORN ENCLOSURE WITH INTER-CHANNEL REFLEX-PORTING

BACKGROUND OF THE INVENTION

The present invention relates to loudspeaker enclosures of the low frequency exponential folded horn type. More specifically, it relates to horn enclosures that are optimized for use on a stage or floor and includes reflex porting in the horn channel.

The current invention relates directly to my previous U.S. Pat. No. 7,520,368 titled "Horizontally Folded Reflex-Ported Bass Horn Enclosure" and can be considered a contribution over my previous invention in that the current invention provides certain advantages by comparatively reducing material and structural complexity by reducing the number of parts, construction operations by reducing the complexity of the remaining parts, and reducing the attendant labor costs, comparatively speaking, without any undue sacrifice of performance. The differences disclosed herein will establish the current invention as being critically distinct in composition and form, with advantages being increased over the cited prior art.

Incorporating the back-wave from a horn driver into a horn channel has been seldom accomplished in the prior art as typically the reflex ports capable of low frequency reinforcement take up too much additional enclosure space, which in the case of a low frequency horn structure is naturally already quite large when seeking an optimal low frequency response. This has led the art in the direction of using a relatively high cutoff for such a bass horn structure to keep it relatively small and necessitating a reflex port tuned to "fill in" the missing low frequencies. This approach still results in a rather large cabinet needed to resonate the typical horn driver below the low frequency cutoff (Fc) of the horn and the porting apparatus displacement which typically reduces the available internal back chamber volume.

Venting reflex ports into a horn channel would eliminate the well-known negative "chuffing" effects associated with ducted ports as well as further preventing excessive bass effects known commonly as "booming". Additionally, by using the same horn channel, the phase response between frequencies would be better retained and presented to the audience in a cohesive manner. In addition, the dispersion pattern would be controlled by the horn structure.

A horn device using a single low frequency driver which utilizes the back wave from the cone in an additive manner without giving up internal back chamber volume for the port device, and tuned to resonate one or more low frequencies into the horn channel would seem to provide a relatively small footprint and overall size compared to the prior art of the same relative response capabilities.

The current invention is relatively economical to build, increases versatility of placement, operates with high efficiency, and provides advantages heretofore not obtained in the prior art.

SUMMARY OF THE INVENTION

It is an object of the present invention to provide a relatively compact package housing a single driver capable of high efficiency operation by horn loading both the front and back waves from the driver in the same horn channel.

An additional object of the present invention is to provide a reduced footprint size when compared to the prior art with a comparable low frequency response. This feature increases portability by reducing weight, and results in further construction cost savings.

It is a further object of the present invention to provide an operational band-pass comparable to most commercially available single-driver corner horns of the prior art and also allow for free-standing use.

The current invention features an appropriately sized mouth terminus for the Fc of 50 Hz in ½ space operation which is intended although not required to exhaust along a single planar boundary such as a floor or ceiling.

The current invention also features an easily scalable but relatively small footprint compared to the prior art of the same overall low frequency response.

DESCRIPTION OF THE INVENTION

The current invention consists of a folded exponential horn enclosure which is horizontally bifurcated symmetrically and arranged within a substantially rectangular outward shape.

The commonly accepted theoretical overall mouth area for a ½ space horn required for the given Fc of 50 Hz is approximately 1314 square inches which is then further reduced by half to 657 square inches (where further waveform expansion presumably takes place outside of the enclosure, as is typical of the genre and is well known in the art), and therefore, the invention in its optimal state, having a mouth terminus area of approximately 640 square inches, is approximately 35 inches in height, which is also determined to present an effective height for the propagation of a top-mounted midrange and/or high frequency horn combination to a seated audience.

Figure 1:
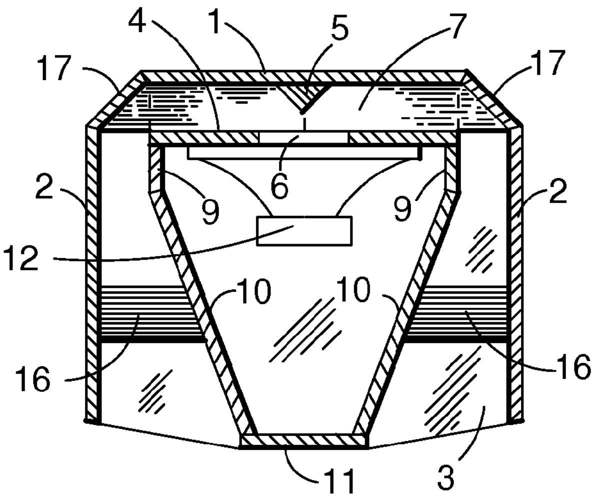
FIG. 1 is a top plan view of the preferred embodiment as derived from line 1-1 of FIG. 2.
Figure 2:
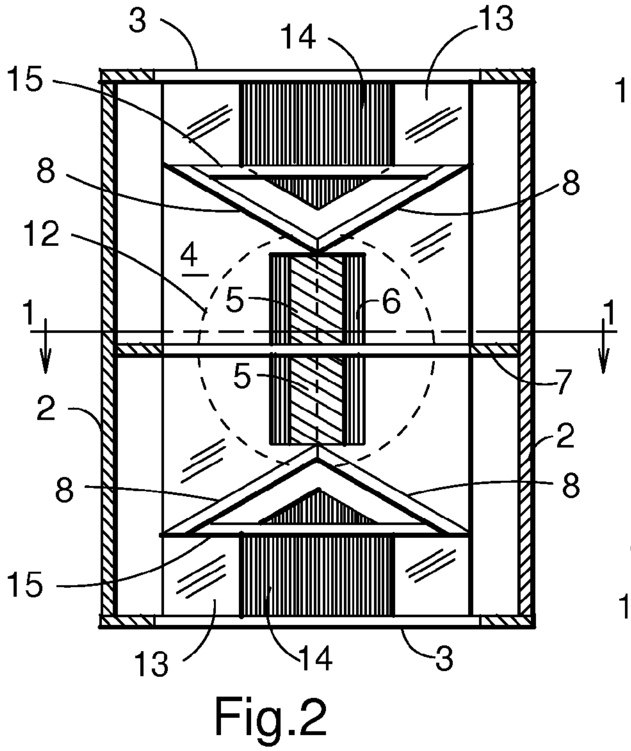
FIG. 2 is a plan elevation view as seen with the rear corner panels and rear panel removed.
Figure 3:
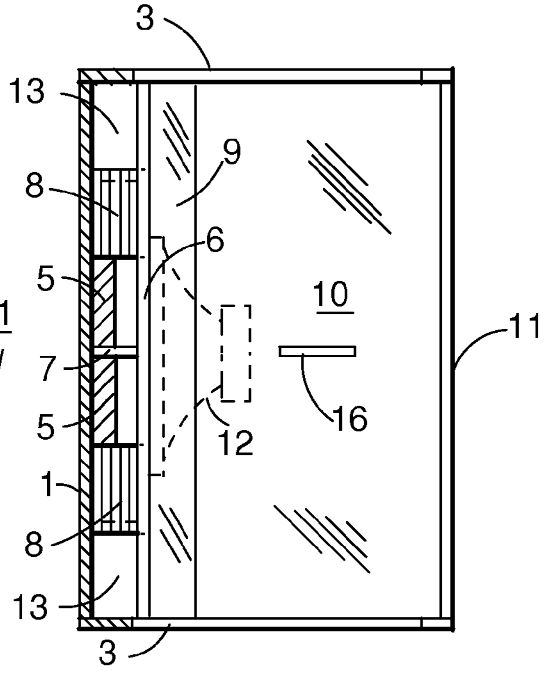
FIG. 3 is a side elevation view as seen with the side and corner panels removed.
Figure 8:
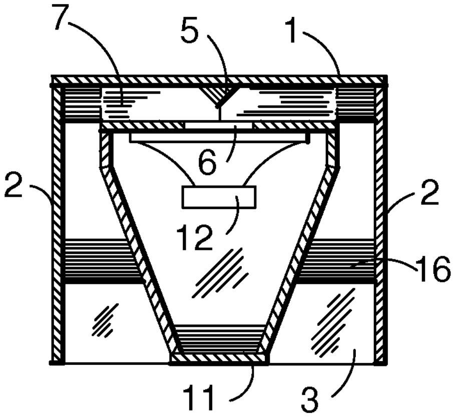
FIG. 8 is a top plan view of an alternative embodiment consistent with the view of FIG. 1.

The preferred embodiment of the invention can be seen in FIGS. 1-4 and 7. FIG. 8 shows an alternative embodiment. Both embodiments are shown employing a single 15-inch driver in a front-loaded configuration shown as element 12 in FIGS. 1, 3 and 8. The driver 12 is arranged with the cone facing rearward in the invention. The driver 12 shown in FIGS. 3 and 8 may optionally be accessed from the top or bottom by use of a removable access panel which is not shown and is common to the art. FIG. 2 shows the invention as viewed from the rear with the rear corner panels 17 and the rear panel 1 removed for clarity. FIG. 3 shows the preferred embodiment of the invention from the left side with the respective rear corner panel 17 and the outer side panel 2 removed for clarity.

The current invention is disclosed in the drawings as being primarily constructed of ¾ inch thick panels.

Exponential expansion rates are used exclusively. The initial throat expansion rate is approximately 60 Hz or an exponential area doubling length of 12 inches, and the terminal exit channel flare rate is 50 Hz or an exponential area doubling length of approximately 16 inches. The throat horn section is best seen in FIGS. 2 and 3. The throat opening 6 area located in baffle board 4 is approximately 78 square inches. The preferred embodiment throat opening 6 cross-sectional area is approximately 13 by 6 inches, the longer of the dimensions being relatively fixed by the diameter of the driver employed, and is arranged vertically in the baffle board 4 best viewed in FIG. 2.

Best seen in FIGS. 1-4, 6, an enabling feature of the current invention is that the bifurcated butterfly throat configuration comprised of the baffle board 4, the throat opening splitting wedge 5, the throat opening parallel brace 7, the throat exponential baffle parts 8 and the rear panel 1, which form the throat horn section which is disposed between the reflex port ducted areas 13 which all subsequently exhaust into the terminal horn section formed from the back chamber angled sides 10, the vertical back chamber parts 9, and the including the mouth formed by the bottom and top panels 3, and the enclosure outer side panels 2. The baffle board 4 has "positive" portions that partially form the port ducted areas shown as elements 13. The "negative" baffle cutouts 14 provide a tuning capability in that the lengths of the ducted port areas 13 also referred to as phase-inverting or reflex ports are determined by the width of the baffle cutouts 14 and further maximize the available internal volume of the back chamber. The baffle cross-member parts 15 act as a structural brace for the rear panel 1 and also act as a wall boundary partially defining the port ducted areas 13. Alternatively, when the reflex port ducted areas 13 are to be tuned higher than 50 Hz or an increase in available back chamber volume is desired, the cross-member parts 15 may optionally be adapted to close off a section of the terminal channel by increasing their respective length, forming a ducted area cooperating with the terminal channel at the channel fold(s) instead of using the baffle board 4 to form the ducted areas 13 as shown in the drawings. In such a case, the baffle board 4 would likely not be made with cutouts 14 but would be made shorter than that shown in the drawings, and the available back chamber volume would increase by more than approximately 300 cubic inches than that shown in the drawings. The alternative porting configuration would conceivably allow for a wider variety of drivers to be effectively utilized.

Referring to FIGS. 1, 4, 7 and 8, the terminal channel braces parts 16 are shown. Many other bracing configurations are possible without changing the operation of the invention. The minimum bracing for reducing unwanted panel vibrations is shown.

The throat channel splitting wedges 5 as best seen in FIGS. 1, 2 and 8, bifurcate the propagated waveform traveling rearward from the throat opening 6 in the baffle board 4 into equal halves horizontally, and turn each half of the propagated waveform 90 degrees from the center in opposite horizontal directions. The splitting wedge 5 is a hard-surface reflector arranged with a 45 degree front-facing surface angle. The use of a full-channel reflector as either a throat splitting wedge or as a fold treatment is also possible as is common to the art.

The horn terminal section outer wall features two outer side panels 2 which in conjunction with the back chamber angled parts 10 form the terminal flare portion of the horn. The terminal pathway is arranged horizontally with the mouth of the terminal section facing forward.

The contiguous space contained within the back chamber formed by elements 3, 4, 9-11 and including the void spaces formed by the baffle cutouts 14 and the rear panel 1 provides a sealed volume of approximately 5 cubic feet as shown in the drawings.

Figure 5:
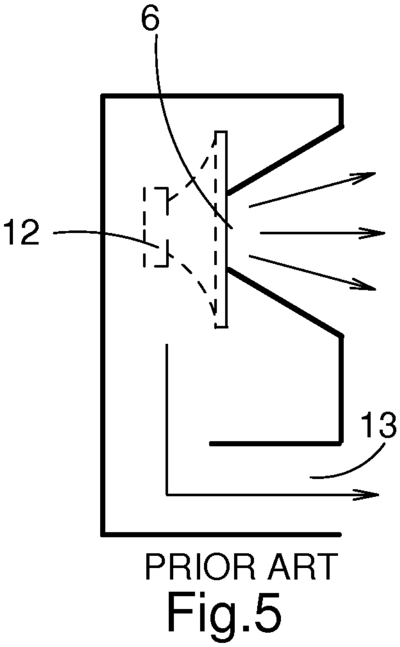
FIG. 5 is a conceptual diagram typical of the prior art.

FIG. 5 shows a conceptualized diagram of the typical layout of a type of prior art enclosure which employ a front-loaded horn with an associated but non-horn loaded reflex-port assembly. The disparity between sound pathway lengths and dispersion patterns can be easily understood to have an expectedly deleterious effect on the waveform phase elements emerging from the enclosure at separate locations, resulting in phase and timing distortions, and in different dispersion and propagation patterns. Additional structure and construction is typically associated with the port areas of the prior art as illustrated.

Figure 6:
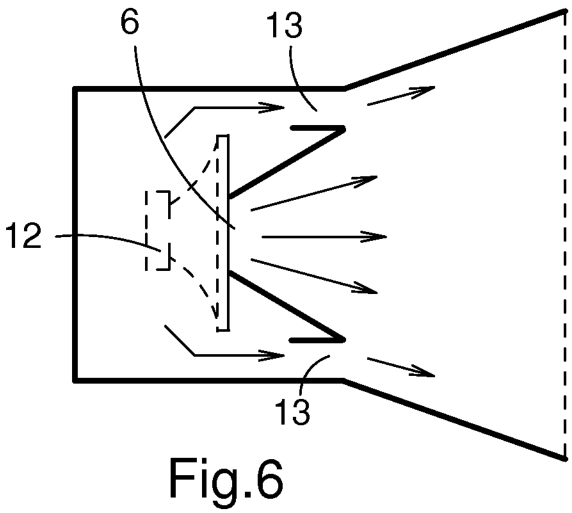
FIG. 6 is a conceptual diagram of the current invention.
Figure 7:
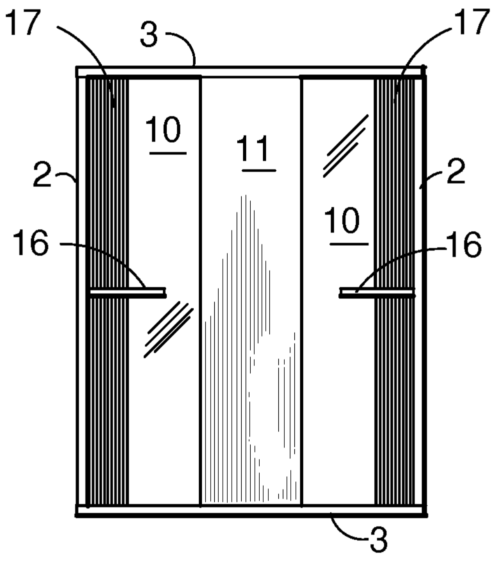
FIG. 7 is a front elevation view of the preferred embodiment.

Referring to FIG. 6, a conceptual diagram of the invention is shown with arrows describing the general pattern of sound wave propagation. The diagram points out that the terminal horn channel is a larger cross-section area than the throat channel section terminus, with the remaining channel space reserved for the exhaustion of the reflex port ducted areas 13. Referring to FIG. 2, the port ducted areas 13 formed by the top and bottom panels 3 and the outer side panels 2 and the cross-member parts 15 in cooperation with the baffle 4 and the rear panel 1. The ability to tune the ports thus formed is associated with the baffle configuration with regards to the linear area defined by the baffle and the baffle cutouts 14 into the back chamber volume best seen in FIG. 2. It should be noted that since four individual ports are available, each port or a combination thereof could optionally be tuned to different resonant frequencies in order to achieve a wider resonant response as desired. As disclosed, the port ducted areas 13 is shown as being equal in length of approximately 5 inches, and is therefore tuned for a resonant peak at approximately 39 Hz which is below the overall Fc of the horn. Other alternative configurations are possible such as when the driver is disposed asymmetrically in the cabinet, presumably for easier access, and the combined ports being relegated to either the top or the bottom of the horn channel instead of being symmetrically distributed as disclosed in the drawings.

Figure 4:
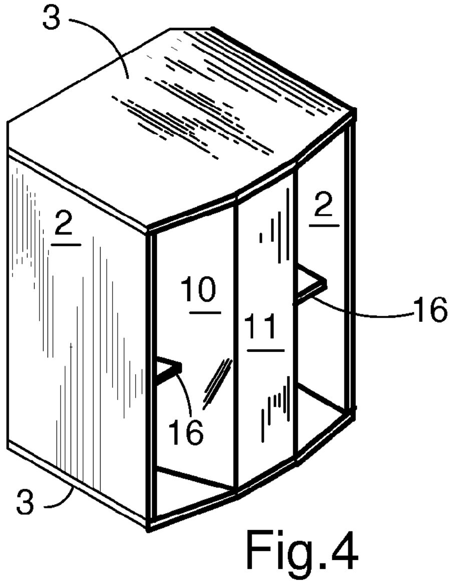
FIG. 4 is a perspective view of the preferred embodiment.

Referring to FIG. 1 the rear corner panels 17 are shown. The corner panels 17 act as a partial enclosure external surface and also as a full-channel reflector in the sound pathway. While not specifically required for operation, the additional benefit of the four vertical corner "cut-back" as seen in FIG. 4 is that the enclosure is typically psychologically estimated as being somewhat smaller in dimension than it actually is when viewed from an angle. An alternative embodiment may omit the cutbacks as desired, however it is likely that the upper frequencies of the operational spectrum would be comparatively degraded if the full-channel reflectors are omitted as is shown in FIG. 8, which discloses a top view of an alternative embodiment which features square corners and no corner channel reflectors. Such an embodiment allows for the later addition of channel reflectors if desired and is therefore considered an economical alternative to the preferred embodiment.

It will be understood by those experienced in the art that the overall Fc of the terminal horn section tends to dictate the size of the enclosure, especially the relatively fixed requirement of mouth size and operational placement; therefore, the cabinets shown may be made larger or smaller than the preferred embodiment depending on the target Fc of the alternative application, with the corresponding throat channels altered appropriately, and alternative drivers may be substituted to suit a particular need. It can also be understood that the optional terminal channel braces 16 of the preferred embodiment would be desirably absent in some applications of the invention.

It should also be realized that optional alternative-use configurations, especially in rear-loaded direct radiator embodiments, the front panel 11 could easily accept multiple drivers, combinations of drivers, or possibly passive radiators which are not shown in the drawings. The possible alternative configurations are therefore many and should not be limited to only that which is defined in the drawings.

Whereas this disclosure depicts one specific type of manufacture, it should not be limited to materials and processes that utilize only straight planar elements, such as plywood and the like. It should also be noted that while straight lines have been used for describing the various horn channels and reflectors, an alternative and perhaps better embodiment could utilize curved or concave elements which would promote an even rotational angle or approximate a true exponential curve more closely.

While in accordance with the provisions of the patent Statutes, the preferred forms and embodiments have been illustrated and described, it will become apparent to those skilled in the art that various changes and modifications may be made without deviating from the inventive.

I claim:

1. In a horn type loudspeaker for operation in a low frequency range, an enclosure of substantially rectangular shape comprised of a plurality of panels in sealed engagement including a horizontally disposed rearwardly arranged at least one horn pathway and at least one rearwardly arranged phase-inverting passage arranged proximately and in parallel operating relation to said horn pathway, said horn and said phase inverting passage both further having laterally arranged outward facing end portions thereof engaged in sealed operating relation with a further horn pathway adapted with at least one throat opening arranged on the rearward end of said further horn pathway adjoining said passage and said horn pathway and sharing a corresponding cross-sectional area therewith and wherein both said passage and said horn pathway exhaust sound waves in a substantially simultaneous manner into said throat opening of said further pathway which subsequently exhausts in a substantially forward direction and said enclosure further including a back chamber assembly, said back chamber comprising a predominantly trapezoidal shape and being vertically aligned and including a rearwardly arranged baffle having at least one throat opening and at least one other opening arranged therein, said first horn pathway further comprising a horizontally bifurcated horizontal channel cooperating in sealed engagement with said baffle, said baffle being vertically arranged, each said channel being directed oppositely from said at least one throat opening, and including horizontally arranged baffles forming the flaring portions therein, and thereby defining a throat section, said further horn pathway further comprising two vertically-proportioned exit channels, said exit channel terminus mouth size appropriate for its planned position, said exit channels comprising a single fold in the horizontal plane, and exhausting equally from both sides of said back chamber, and wherein the horn expansion is substantially defined by said trapezoid sides whereby the sides of said back chamber further complete said exit channels, said further horn pathway further comprising an area in said further horn throat opening as substantially dimensioned at least equal to the same vertical dimension as that of said terminal channel mouth, and thereby being at least equally sized in area to the combined mouth area of said throat section and the cross-sectional area of said frequency-sensitive passage, said phase-inverting passage further comprising at least one horizontally arranged partitioning baffle forming an interior surface of said passage, said partitioning baffle arranged to terminate in vertical planar relation with the mouth of said throat section and said rearward baffle further arranged and adapted to further define at least one volumetrically determined frequency-specific passage connected in sealed operating relation to said other opening at one end and connected at the opposite end in sealed operating relation to a corresponding portion of said throat opening of said further horn pathway which exhaust sound waves from said back chamber into said terminal channel proximate to said throat section, thereby forming partially enclosed tunable sections, a top panel and a bottom panel completing said back chamber assembly, said tunable passages, and said terminal exit channels.

2. In a horn type loudspeaker as set forth in claim 1, wherein said tunable sections are arranged symmetrically both above and below said throat section.

3. In a horn type loudspeaker as set forth in claim 1, wherein said tunable sections are arranged above said throat section.

4. In a horn type loudspeaker as set forth in claim 3, wherein said tunable sections are arranged below said throat section.

5. A folded horn enclosure comprising:

a horn structure including at least two flaring horn sections serially conjoined in operating relation, and further comprising at least one first said flaring pathway having an inlet and an outlet, said inlet comprising a throat opening therein, said first pathway proceeding from the front of at least one driver at said inlet and at least one second non-flaring pathway having an inlet and an outlet, said inlet for sound waves from the back of said driver, wherein said outlets of said flaring pathway and said second non-flaring pathway are operationally connected to a unitary throat opening of an at least one said second flaring horn section whereby sound waves from both sides of said driver are directed through said second horn section and subsequently exit said enclosure, said conjoining arranged proximate to said throat opening, the said first flaring section being operationally engaged and fully encircled at the mouth by the said throat opening of said second horn section and wherein the said second section throat comprises a larger cross-sectional area than the cross-sectional area of the mouth of the said first section, said throat opening cross-sectional area further adapted to include said second pathway from said driver cross-sectional area, said structure further including a back chamber housing said driver, said second pathway being open-ended and further adapted in sealed operating relation with said throat opening in said second horn section to exhaust in a specific frequency range substantially simultaneously with said first horn section into said second section, said terminal section being arranged in sealed operating engagement with said outward-most end of said second pathway, said back chamber thereby being exclusively vented to the atmosphere by said open-ended pathway and said second horn section, said open-ended pathway further arranged rearwardly of said back chamber and further adapted to exhaust substantially simultaneously with said first section into the throat of the second of said horn sections proximate to the conjoining area of the said sections, said at least open-ended pathway further being partially defined by the spatial separation between said first section mouth terminus and said second section throat opening, the internal volume of air contained therein at least partially determining the specific frequency at which said volume of air will vibrate and produce sound waves in said second section throat, said open-ended pathway further arranged to exhaust in a direction substantially parallel to said first section pathway into said second section.

6. In a folded horn loudspeaker for reproducing low frequencies, an enclosure with a predominately rectangular footprint consisting of a substantially vertically-elongated shape comprised of panels arranged in sealed engagement, including a butterfly throat horn section arranged rearwardly therein perpendicular to the central longitudinal axis of said enclosure, bifurcating said throat channel symmetrically with each said bifurcated channel having a horizontal pathway, said chamber partially comprised of convergently-angled panels, said chamber being inwardly and axially arranged in said enclosure, said rearward panel having a throat opening to transmit sound waves into said throat section, and at least one sound producing driver being housed therein, said convergently-angled panels partially defining a further section of horn having a lower flare rate, progressing from said throat section on opposite sides of said back chamber, and being enclosed at the outward sides by panels forming the outer sides of said enclosure, said further section exhausting at the end of the enclosure opposite of said throat section and thereby forming a terminus for said horn section, said terminus having a predominately rectangular proportion therein, said further section arranged with a larger throat cross-sectional area compared to said throat section mouth area, said back chamber including horizontally arranged tuned passages conjoined in operating relation to said larger throat of said further section to exhaust substantially parallel to and in relation with said horizontal passages into said larger throat of said further section, said throat of said further section adapted and arranged in sealed operating relation with at least one mouth opening of said butterfly section and said larger cross-section corresponding further to said open-ended pathways cross-section through which said sound waves transit, said passages and said butterfly throat section thereby constituting at least two open-ended pathways for transmitting sound waves respectively emanating from said back chamber and the front of said driver into the said throat of said further section, forming a confluence of said sound waves therein, said sound waves from said driver exclusively thereby subsequently exiting from said enclosure to the atmosphere through said terminus of said further section, completing means for said throat section, said further section and said back chamber, means for access into said back chamber, and means for exhausting said terminus into the atmosphere.

7. In a folded horn loudspeaker as set forth in claim 6, wherein said completing means includes a top and bottom panel.

8. In a folded horn loudspeaker as set forth in claim 7, wherein said completing means further includes a front panel on said back chamber.

9. In a folded horn loudspeaker as set forth in claim 8, wherein said exhausting means includes said mouth total cross-sectional area is theoretically optimized for floor operation.

10. In a folded horn loudspeaker as set forth in claim 7, wherein said access means is defined by a removable panel arranged in sealed engagement with said top panel.

11. In a folded horn loudspeaker as set forth in claim 7, wherein said access means is defined by a removable panel arranged in sealed engagement with said bottom panel.

12. A folded low frequency horn enclosure, comprising:

an inwardly arranged back chamber assembly with rearwardly arranged openings adapted therein and an outwardly arranged assembly comprised of panels, said outward assembly comprising a substantially elongated rectangular shape and having a central axis arranged front to back therein, said back chamber assembly comprising an axially perpendicular bifurcated throat assembly adapted in sealed relation with one of said openings which exhausts into two separate terminal channels using a lower flare rate, said back chamber housing at least one driver, said driver producing a front sound wave into a first of said openings and a back sound wave through a second of said openings, said terminal channels adapted with a larger cross-section throat area than said throat assembly mouth area, and further having at least one cooperating laterally-arranged inward opening arranged therein, said back chamber further adapted with a rearward at least one bilaterally-exhausting tuned port arranged proximate to said throat assembly and terminating equally therewith, said at least one tuned port arranged perpendicular to said axis and connected in sealed operating relation with at least one of said second openings at one end and further connected in sealed operating relation to said inward opening of said terminal channel at the opposite end thereof to exhaust in phased relation substantially parallel to and further arranged in proximate relation with said throat assembly whereby said exhaustion through the said inward opening of said terminal channels therein combine in said larger cross-section, said larger cross-section being at least equal to the combined cross-sections of said tuned port and at least one mouth opening of said bifurcated throat assembly, said back chamber assembly having rearward openings therein enclosed in sealed operating relation by said throat assembly and said at least one tuned port, and wherein the said front wave of said throat assembly and the said back wave of said tuned port are combined in phase relation and are further operationally enclosed by said outward assembly terminal channels, and thereby being finally transmitted through said terminal channel, said terminal channels further cooperating with said back chamber to each exhaust parallel to said axis at the opposite end of said enclosure from said throat assembly and thereby forming a horn mouth.

13. A folded low frequency horn enclosure as set forth in claim 12, wherein said tuned ports are arranged above said throat assembly.

14. A folded low frequency horn enclosure as set forth in claim 12, wherein said tuned ports are arranged below said throat assembly.

15. A folded low frequency horn enclosure as set forth in claim 12, wherein said tuned ports are symmetrically arranged both above and below said throat assembly.

* * * * *